United States Patent [19]

Raynaud et al.

[11] Patent Number: 5,430,410
[45] Date of Patent: Jul. 4, 1995

[54] AMPLIFIER BIAS CONTROL SYSTEM

[75] Inventors: Fabrice Raynaud, Nanterre; Patrice Regnier, Courbevoie, both of France

[73] Assignee: Alcatel N.V., Amsterdam, Netherlands

[21] Appl. No.: 266,373

[22] Filed: Jun. 27, 1994

[30] Foreign Application Priority Data

Jun. 30, 1993 [FR] France ................................ 9307998

[51] Int. Cl.⁶ .............................................. H03G 3/20
[52] U.S. Cl. ...................................... 330/279; 330/136
[58] Field of Search ............... 330/129, 136, 279, 284, 330/285

[56] References Cited

U.S. PATENT DOCUMENTS 3,918,003  11/1975  Seidel ............................ 330/136 X
5,208,550   5/1993  Iwane ............................ 330/279 X

FOREIGN PATENT DOCUMENTS

0509733A2  10/1992  European Pat. Off. .
0523718A2   1/1993  European Pat. Off. .
WO92/05631  4/1992  WIPO .

*Primary Examiner*—Steven Mottola
*Attorney, Agent, or Firm*—Sughrue, Mion, Zinn, Macpeak & Seas

[57] ABSTRACT

A system for controlling the bias of an amplifier samples a fraction of the amplified input signal, attenuates the sampled signal, detects the attenuated signal, compares the detected voltage with a reference voltage and supplies a logic level, receives this logic level and generates a control signal applied to the signal attenuator so that the detected voltage is substantially equal to the reference voltage, and generates the bias signal. The bias signal generator receives the control signal from the control signal generator. The bias of the amplifier is the lowest possible commensurate with amplification of the input signal without clipping.

12 Claims, 4 Drawing Sheets

AMPLIFIER BIAS CONTROL SYSTEM

BACKGROUND OF THE INVENTION

1. Field of the Invention

The field of the invention is that of amplifier bias control systems. The invention applies in particular to power microwave amplifiers with a wide output power dynamic range used in TDMA (Time-Division Multiple Access) signal transmitters and receivers.

The present invention is directed to optimizing the efficiency of an amplifier used to transmit or receive radio signals, for example TDMA signals. It provides a constant amplifier gain by biasing the amplifier so that the signal applied to it is amplified linearly, with minimal power consumption, i.e. with minimal bias. The invention applies to all TDMA signals, regardless of the receive packet length, their amplitude, their dynamic range and their relative timing.

2. Description of the Prior Art

European patent application No 0 472 330 (MATSUSHITA ELECTRIC INDUSTRIAL CO. LTD) describes a system for amplifying a TDMA microwave signal in which a diode detector detects the amplitude of the output signal of an amplifier. This detector cooperates with a digital attenuator receiving the envelope of the amplified signal to increase the sensitivity of the detector on its output side, which in theory is limited to approximately 20 dB. The attenuator is therefore governed by a control law determined beforehand according to the envelope of the signal to be amplified.

The major drawback of this type of system is that it requires a circuit, for example an EEPROM, to generate the envelope of the signal to be amplified. Programming this EEPROM entails a knowledge of the length of the packets received and their relative timing. It is also necessary to use a linearizer in the control system of the amplifier to compensate for the non-linear characteristic of the detector diode.

SUMMARY OF THE INVENTION

To remedy these drawbacks, the invention proposes a system for controlling the bias of an amplifier receiving an input signal and a bias signal, said amplifier producing an amplified output signal and including:

- means for sampling a fraction of the input signal or the output signal and supplying a sampled signal;
- means for attenuating the sampled signal and supplying an attenuated signal;
- means for detecting the attenuated signal and supplying a detected voltage;
- means for comparing the detected voltage with a reference voltage and supplying a logic level;
- control means for receiving the logic level and supplying a control signal applied to the attenuator means so that the detected voltage is substantially equal to the reference voltage;
- means for generating the bias signal receiving the control signal from the control means, said means cooperating with each other so that the gain of the amplifier is constant and in the linear range of amplification and so that the bias of said amplifier is as low as possible commensurate with amplification of the input signal without clipping.

The control means advantageously comprise a counter-downcounter generating binary words and the means for generating the bias signal advantageously comprise a digital-analog converter receiving the binary words from the counter-downcounter and supplying an analog signal to a lowpass filter whose output signal constitutes the bias control signal.

The attenuator means preferably comprise a set of digitally controlled attenuators connected in cascade, said attenuators cooperating with a decoder receiving the binary words.

The amplifier whose bias is controlled advantageously includes at least one microwave transistor.

In one advantageous embodiment of the invention the system includes:

- means for sampling a fraction of the input signal and supplying a first sampled signal;
- means for sampling a fraction of the output signal and supplying a second sampled signal;
- means for attenuating the first sampled signal and supplying a first attenuated signal;
- means for attenuating the second sampled signal and supplying a second attenuated signal;
- means for detecting the first attenuated signal and supplying a first detected voltage;
- means for detecting the second attenuated signal and supplying a second detected voltage;
- means for comparing the first detected voltage with a first reference voltage and supplying a first logic level;
- means for comparing the second detected voltage with a second reference voltage and supplying a second logic level;
- control means receiving the first logic level and supplying a first control signal applied to the means for attenuating the first sampled signal so that the first detected voltage is substantially equal to the first reference voltage;
- control means receiving the second logic level and supplying a second control signal applied to the means for attenuating the second sampled signal so that the second detected voltage is substantially equal to the second reference voltage;
- means for subtracting the first control signal from the second control signal to obtain a difference signal;
- means for generating the bias signal receiving the difference signal and supplying to the amplifier a voltage Vco equal to:

$$Vco = Vpo + \mu \cdot Va_1 - h \cdot (Va_2 - Va_1)$$

where Vpo is an offset voltage, $\mu$ and h are constants, and $Va_1$ and $Va_2$ are respectively the first and second control signals.

Thus drift in the amplifier characteristics is corrected.

Each detector means preferably comprises a voltage detector diode and each of the first and second reference voltages is preferably equal to:

$$Vr - k \cdot V \cdot (To - T)$$

where Vr is a fixed voltage, k is a positive temperature constant of a temperature sensing diode disposed near the respective voltage detector diode, V is the voltage supplied by the temperature sensing diode, To is a reference temperature and T is ambient temperature.

Thus variations in ambient temperature are also compensated.

Other features and advantages of the invention emerge from the following description of a preferred embodiment of the invention given by way of non-limit-

DETAILED DESCRIPTION OF THE PREFERRED EMBODIMENT

Figure 1:
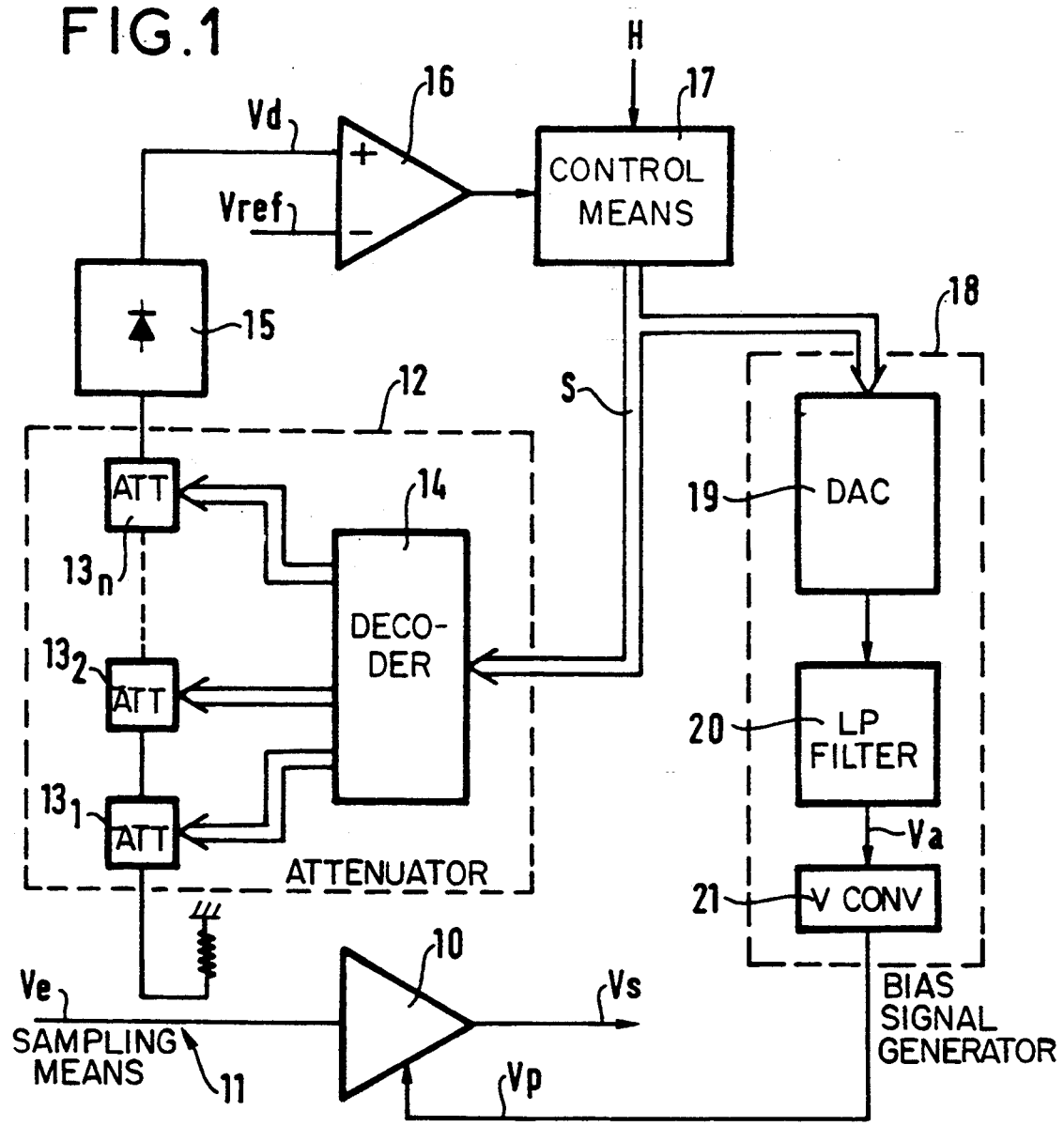
FIG. 1 is a block diagram of a first preferred embodiment of the invention.

FIG. 1 is a block diagram of one preferred embodiment of the invention.

An amplifier 10 whose efficiency is to be optimized receives a microwave input signal Ve to be amplified and supplies an amplified signal Vs. The amplifier 10 also receives a bias signal Vp on a control input. Means 11 such as a directional coupler, for example, samples a portion of the input signal Ve and supplies a sampled signal to means 12 for attenuating the sampled signal. The attenuator means 12 in this example comprise n digital attenuators $13_1, 13_2, \ldots, 13_n$ in a cascade arrangement under the control of a decoder 14. The attenuator means 12 supply an attenuated signal to detector means 15 in the form of a diode detector. This detector supplies a detected voltage Vd to comparator means 16 which compare the detected voltage Vd to a reference voltage Vref.

The comparator means 16 comprise an operational amplifier with hysteresis, for example. The output of this amplifier supplies a logic level (0 or 1) to control means 17 which generate a control signal S applied to the attenuator means 12 so that the detected voltage Vd is substantially equal to the reference voltage Vref. This loop controls the attenuator means 12 so that the detected voltage Vd is equal to Vref. The control signal S has a value which increases if the operational amplifier 16 outputs a logic 1 level or a value which decreases if the operational amplifier 16 outputs a logic 0 level.

Figure 4:
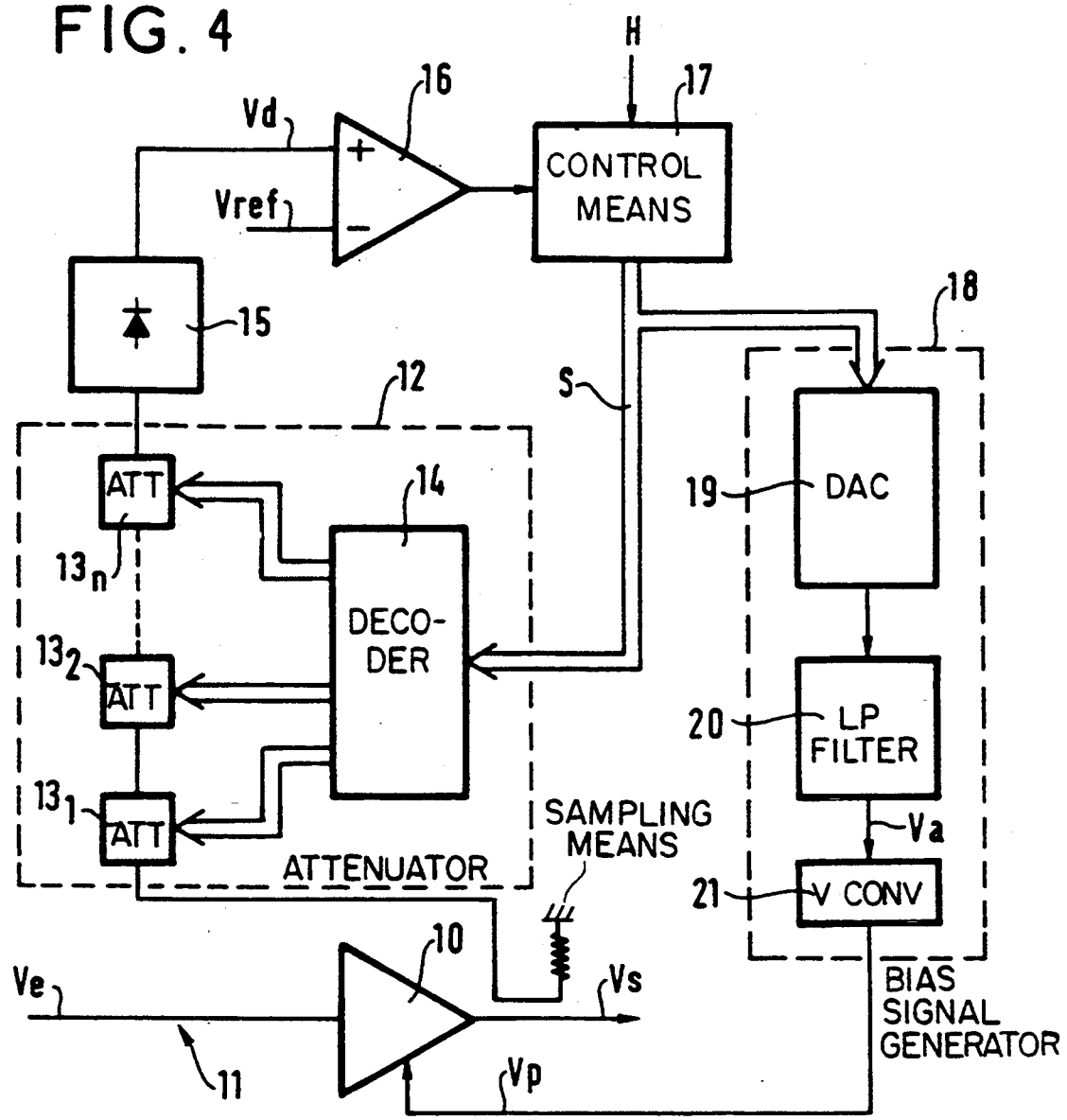
FIG. 4 is a block diagram of the first preferred embodiment with the sampling means sampling a fraction of the output signal Vs.

Note that the sampling means 11 can equally sample a fraction of the output signal Vs of the amplifier 10, this circuit then constituting a feedback loop whereas the system shown in FIG. 1 is of the feedforward type (see FIG. 4).

To protect the detector 15 the attenuators are set to their maximum value when the system is initialized. Accordingly, as long as the voltage Vd is less than Vref a low logic level is present at the input of the control means 17 which generates a binary number which decreases constantly until Vd is greater than Vref.

The binary number is coded on a number of bits which depends on the number of attenuators. For example, use of three 4-bit digital attenuators provides a dynamic range of 60 dB for frequencies from DC up to 2 GHz.

The control means 17 can obviously be of the analog type instead, for example comprising an integrator supplying the voltage whose variation controls analog attenuator means so that Vd is equal to Vref. The attenuator control system is more complex in that they must operate in their linear region, however. The comparator means 16 preferably have hysteresis to avoid excessively frequent output transitions.

The voltage Vref depends on the characteristics of the diode detector 15 and represents a voltage for which the characteristic $I = f(U)$ of the detector has a minimal slope on either side of this operating point, i.e. a point at which the sensitivity of the detector is greatest.

Figure 5:
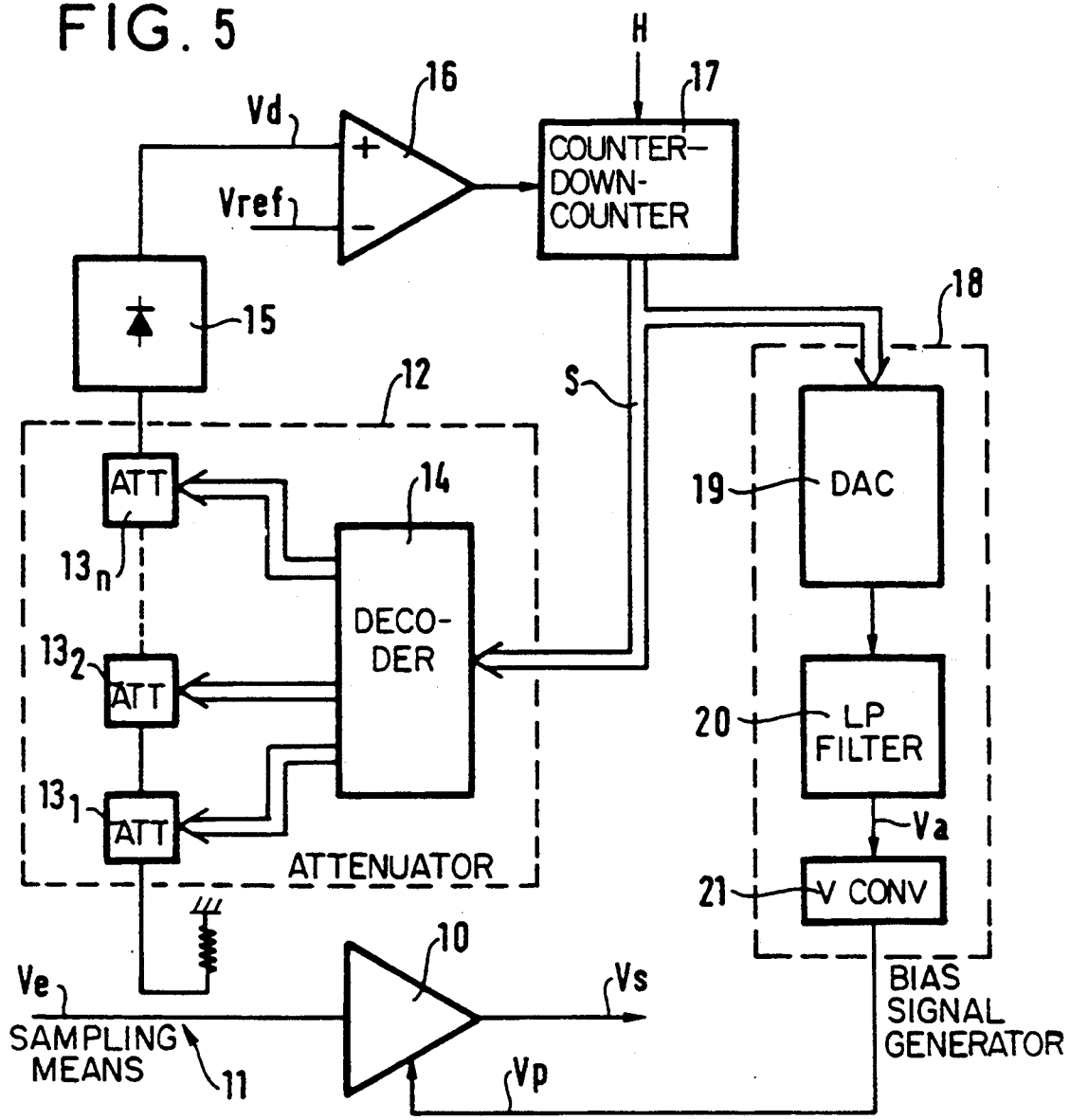
FIG. 5 is a block diagram of the first preferred embodiment with the control means being a counter-downcounter.

The control means are of the digital type in this example and thus supply binary words at the frequency of a control clock H. They can comprise a counter-downcounter whose output binary word a has a weight that is increased or reduced on each clock pulse H depending on the result of comparing Vd and Vref (see FIG. 5).

The control signal S is also applied to means 18 for generating the bias signal applied to the amplifier 10. In FIG. 1 these means comprise a digital-analog converter 19 followed by a lowpass filter 20 supplying a voltage Va. A voltage converter 21 supplies the bias voltage Vp to the amplifier 10. The converter 21 converts Va into $Vp = a \cdot Va + b$, for example, where a and b are constants, and so ensures that the amplifier 10 is biased with sufficient current to amplify Ve without clipping and with a minimum bias current. The gain of the amplifier 10 is then largely constant in the linear range of amplification and its bias current is matched to the power of the signal applied to its input.

Figure 2:
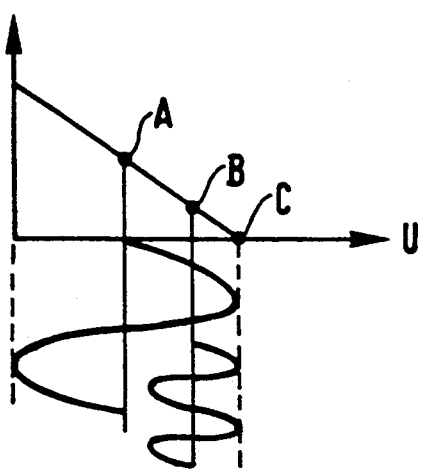
FIG. 2 shows a static load line of a transistor constituting the amplifier of FIG. 1.

The operation of the device of the invention will be better understood from the following description of FIG. 2 which represent a static load line of a transistor constituting the amplifier 10.

Three operating points A, B and C are shown. The operating point A corresponds to operation in class A: the bias of the amplifier is maximal so that the high amplitude signal applied to the amplifier input is amplified without saturation. For a lower amplitude signal, on the other hand, amplification without clipping is obtained by placing the operating point at point B, i.e. by reducing the amplifier bias current. Thus the amplifier bias is matched to the amplitude of the input signal for optimum efficiency. Note that the operating point C corresponds to absence of any signal to be amplified. The amplifier is then idle and does not consume any current.

The present invention is preferably applied to amplifiers in the form of power MOSFETs operating at microwave frequencies. A plurality of transistors of this type can be connected in cascade.

The system described with reference to FIG. 1 can be improved to allow for drift in the characteristics of the amplifier 10. It is necessary to compensate for such drift if linear amplification is to be achieved and this makes it necessary to place a second detector at the output of the amplifier. It is also desirable to compensate for temperature drift which shifts the operating point of the detector 15.

Figure 3:
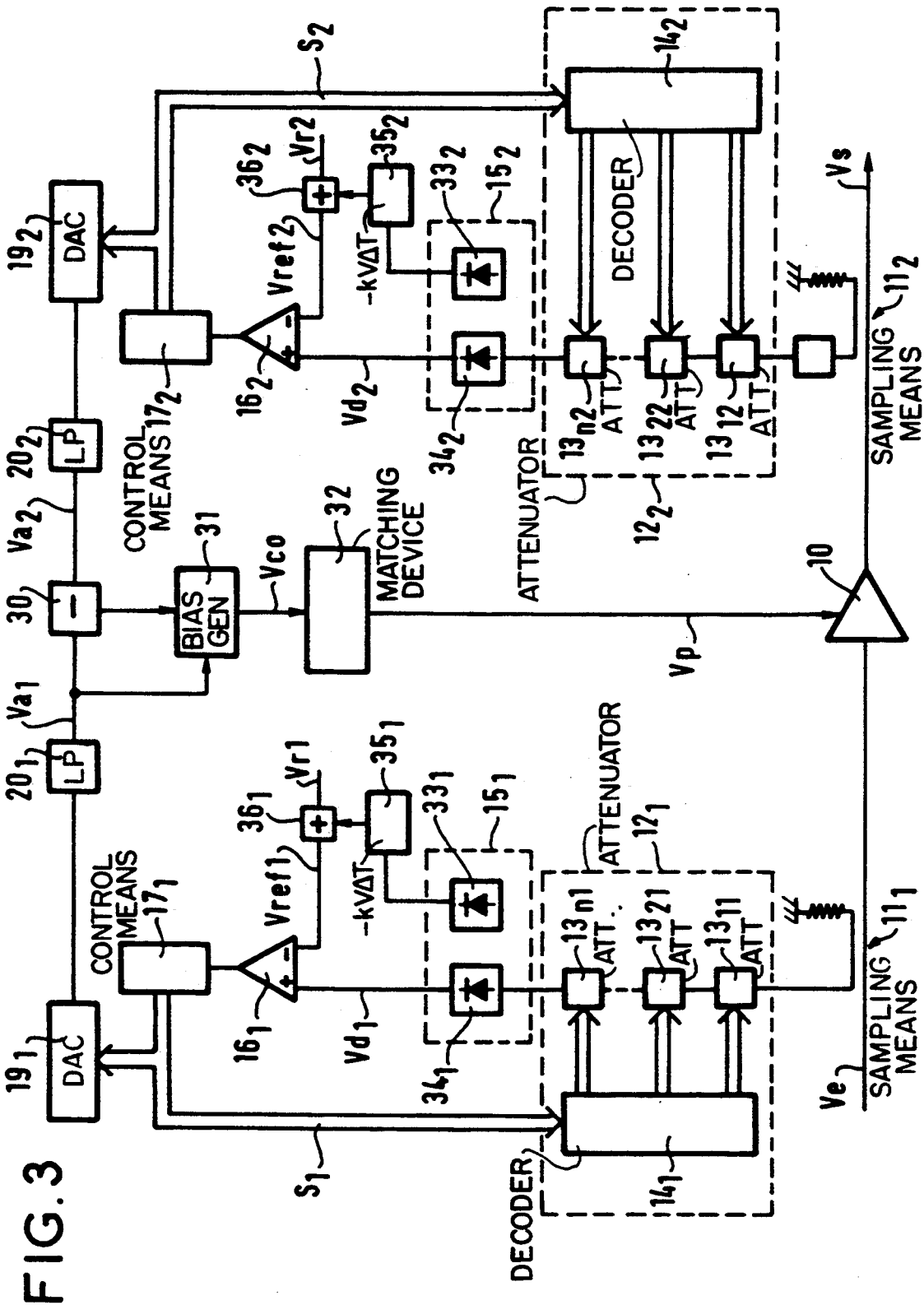
FIG. 3 is a block diagram of an embodiment of the invention which can allow for drift in operating parameters of the amplifier and for changes in temperature.

FIG. 3 is a block diagram of an embodiment of the invention which can allow for temperature changes and changes in the operating parameters of the amplifier.

The system shown includes units identical to those described with reference to FIG. 1 in which the detector received a fraction of the attenuated input (or output) signal and includes identical units processing the output signal of this amplifier. It includes:

means $11_1$ for sampling a fraction of the input signal Ve and supplying a first sampled signal;

means $11_2$ for sampling a fraction of the output signal and supplying a second sampled signal;

means $12_1$ for attenuating the first sampled signal and supplying a first attenuated signal;

means $12_2$ for attenuating the second sampled signal and supplying a second attenuated signal;

means $15_1$ for detecting the first attenuated signal and supplying a first detected voltage $Vd_1$;

means for detecting the second attenuated signal and supplying a second detected voltage $Vd_2$;

means $16_1$ for comparing the first detected voltage $Vd_1$ with a first reference voltage $Vref_1$ and supplying a first logic level;

means $16_2$ for comparing the second detected voltage $Vd_2$ with a second reference voltage $Vref_2$ and supplying a second logic level;

control means $17_1$ for receiving the first logic level and producing a first control signal $S_1$ applied to the means $12_1$ for attenuating the first sampled signal so that the first detected voltage $Vd_1$ is substantially equal to the first reference voltage $Vref_1$;

control means $17_2$ for receiving the second logic level and producing a second control signal $S_2$ applied to the means $12_2$ for attenuating the second sampled signal so that the second detected voltage $Vd_2$ is substantially equal to the second reference voltage $Vref_2$;

means 30 for subtracting the first control signal S1 from the second control signal S2 to obtain a difference signal S2−S1; in this example the subtraction means comprise digital-analog converters $19_1$ and $19_2$ driving lowpass filters $20_1$ and $20_2$ and $S_2−S_1$ is equivalent to $Va_2−Va_1$;

means 31 for generating the bias signal receiving the difference signal $Va_2−Va_1$ and supplying to the amplifier 10 a voltage Vco equal to:

$$Vco = Vpo + \mu.Va_1 - h.(Va_2 - Va_1)$$

where Vpo is an offset voltage, $\mu$ and h are constants, and $Va_1$ and $Va_2$ are respectively the first and second control signals.

A transistorized device 32 can be added to match the voltage Vco to the amplifier 10 by setting Vp+a.Vco+b where a and b are constants. This produces a bias current matched to the amplifier used.

The voltage Vco therefore tracks changes in the input voltage Ve but is also modulated by the gain of the amplifier. This allows for drift in the characteristics of the amplifier. The amplifier therefore operates in the required linear gain region and the bias current is optimized, i.e. has the lowest possible value without clipping of the amplified signal occurring.

Temperature compensation of each detector can be achieved by means of temperature sensing diodes identical to the voltage detector diodes used to obtain $Vd_1$ and $Vd_2$ and located near the latter so they are subject to the same changes with temperature. The temperature sensing diodes are the diodes $33_1$ and $33_2$ and the voltage detector diodes supplying $Vd_1$ and $Vd_2$ are the diodes $32_1$ and $32_2$. The output voltages of the temperature sensing diodes $33_1$ and $33_2$ are fed to modules $35_1$ and $35_2$ each supplying an output voltage equal to:

$$-k.V(To-T)$$

where k is the temperature constant of the temperature sensing diode used (k>0), V is the voltage produced by this diode, To is a reference temperature (for example 25° C.) and T is ambient temperature.

The output voltages of these modules are applied to summing device $36_1$ and $36_2$ which also receive fixed voltages $Vr_1$ and $Vr_2$. The summing devices supply at their outputs the reference voltages $Vref_1$ and $Vref_2$. This compensates for variations in ambient temperature which move the operating point of the voltage detector diodes $34_1$ and $34_2$.

The means $11_2$ for sampling a fraction of the output signal of the amplifier preferably comprise a fixed attenuator 37 the attenuation of which is such that the level of the output signal it produces is equal to that from the sampling means $11_1$. The devices on the input and output sides of the amplifier 10 can then be identical as they operate with comparable input powers.

The present invention can optimize the biasing of an amplifier over a very wide dynamic range whilst remaining independent of the input signal envelope. The power dissipated by the amplifier is reduced and radio signal transmitters and/or receivers powered by dry cells or accumulator batteries can operate for longer periods between battery replacement or recharging.

There is claimed:

1. System for controlling the bias of an amplifier receiving an input signal and a bias signal, said amplifier producing an amplified output signal and including:

means for sampling a fraction of said input signal and supplying a sampled signal;

means for attenuating said sampled signal and supplying an attenuated signal;

means for detecting said attenuated signal and supplying a detected voltage;

means for comparing said detected voltage with a reference voltage and supplying a logic level;

control means receiving said logic level and supplying a control signal applied to said attenuator means so that said detected voltage is substantially equal to said reference voltage;

means for generating said bias signal receiving said control signal from said control means, said means cooperating with each other so that the gain of said amplifier is constant and in the linear range of amplification and so that the bias of said amplifier is as low as possible commensurate with amplification of said input signal without clipping.

2. System according to claim 1 wherein said control means comprise a counter-downcounter generating binary words.

3. System according to claim 1 wherein said means for generating said bias signal comprise a digital-analog converter receiving said binary words from said counter-downcounter and supplying an analog signal to a lowpass filter whose output signal constitutes said bias signal.

4. System according to claim 1 wherein said attenuator means comprise a set of digitally controlled attenuators connected in cascade, said attenuators cooperating with a decoder receiving said binary words.

5. System according to claim 1 wherein said amplifier includes at least one microwave transistor.

6. System for controlling the bias of an amplifier receiving input signals and a bias signal, said amplifier supplying an amplified output signal, including:

means for sampling a fraction of said input signal and supplying a first sampled signal;

means for sampling a fraction of said output signal and supplying a second sampled signal;

means for attenuating said first sampled signal and supplying a first attenuated signal;

means for attenuating said second sampled signal and supplying a second attenuated signal;

means for detecting said first attenuated signal and supplying a first detected voltage;

means for detecting said second attenuated signal and supplying a second detected voltage;

means for comparing said first detected voltage with a first reference voltage and supplying a first logic level;

means for comparing said second detected voltage with a second reference voltage and supplying a second logic level;

control means receiving said first logic level and supplying a first control signal applied to said means for attenuating said first sampled signal so that said first detected voltage is substantially equal to said first reference voltage;

control means receiving said second logic level and supplying a second control signal applied to said means for attenuating said second sampled signal so that said second detected voltage is substantially equal to said second reference voltage;

means for subtracting said first control signal from said second control signal to obtain a difference signal;

means for generating said bias signal receiving said difference signal and supplying to said amplifier a voltage Vco equal to:

$$Vco = Vpo + \mu \cdot Va_1 - h \cdot (Va_2 - Va_1)$$

where Vpo is an offset voltage, $\mu$ and h are constants, and $Va_1$ and $Va_2$ are respectively said first and second control signals.

7. System according to claim 6 wherein each detector means comprises a voltage detector diode and each of said first and second reference voltages is equal to:

$$Vr - k \cdot V \cdot (To - T)$$

where Vr is a fixed voltage, k is a positive temperature constant of a temperature sensing diode disposed near the respective voltage detector diode, V is the voltage supplied by said temperature sensing diode, To is a reference temperature and T is ambient temperature.

8. System for controlling the bias of an amplifier receiving an input signal and a bias signal, said amplifier producing an amplified output signal and including:

means for sampling a fraction of said output signal and supplying a sampled signal;

means for attenuating said sampled signal and supplying an attenuated signal;

means for detecting said attenuated signal and supplying a detected voltage;

means for comparing said detected voltage with a reference voltage and supplying a logic level;

control means receiving said logic level and supplying a control signal applied to said attenuator means so that said detected voltage is substantially equal to said reference voltage;

means for generating said bias signal receiving said control signal from said control means, said means cooperating with each other so that the gain of said amplifier is constant and in the linear range of amplification and so that the bias of said amplifier is as low as possible, commensurate with amplification of said input signal without clipping.

9. System according to claim 8, wherein said control means comprise a counter-downcounter generating binary words.

10. System according to claim 8, wherein said means for generating said bias signal comprise a digital-analog converter receiving said binary words from said counter-downcounter and supplying an analog signal to a lowpass filter whose output signal constitutes said bias signal.

11. System according to claim 8, wherein said attenuator means comprise a set of digitally controlled attenuators connected in cascade, said attenuators cooperating with a decoder receiving said binary words.

12. System according to claim 8, wherein said amplifier includes at least one microwave transistor.

* * * * *